United States Patent
Altizer et al.

(10) Patent No.: US 10,159,167 B2
(45) Date of Patent: Dec. 18, 2018

(54) COOLING APPARATUS WITH A CONTROL SYSTEM FOR COOLING MICROPROCESSOR BASED EQUIPMENT

(71) Applicant: Rack Cooling Technologies LLC, Sterling, VA (US)

(72) Inventors: Stephen Browning Altizer, Charlottesville, VA (US); Robert Mitchell Menuet, Orlean, VA (US)

(73) Assignee: Rack Cooling Technologies LLC, Sterling, VA (US)

(*) Notice: Subject to any disclaimer, the term of this patent is extended or adjusted under 35 U.S.C. 154(b) by 0 days.

(21) Appl. No.: 15/267,837

(22) Filed: Sep. 16, 2016

(65) Prior Publication Data
US 2017/0079163 A1  Mar. 16, 2017

Related U.S. Application Data

(60) Provisional application No. 62/219,405, filed on Sep. 16, 2015.

(51) Int. Cl.
*H05K 7/20* (2006.01)

(52) U.S. Cl.
CPC ..... *H05K 7/20736* (2013.01); *H05K 7/20836* (2013.01)

(58) Field of Classification Search
CPC .. H05K 7/20836; H05K 7/20736; H05K 7/20; H05K 7/20209; H05K 7/202; F24F 11/77; F24F 11/30; F24F 11/46; F24F 2110/10; F24F 2110/00; F25D 2700/14; F25D 2700/123

USPC ....... 361/679.49, 679.48, 688, 690; 454/229, 454/256, 184, 258; 165/287; 62/158
See application file for complete search history.

(56) References Cited

U.S. PATENT DOCUMENTS

| | | | |
|---|---|---|---|
| 5,634,346 A * | 6/1997 | Ramakrishnan ... | G05D 23/1904 62/89 |
| 6,336,592 B1 * | 1/2002 | Russell ............. | H05K 7/20209 165/291 |
| 6,390,114 B1 * | 5/2002 | Haandrikman .... | B01D 19/0063 137/187 |
| 6,639,794 B2 | 10/2003 | Olarig et al. | |

(Continued)

OTHER PUBLICATIONS

Sell Server Cabinet Cooling Unit, http://racktech.en.ec21.com/offer_detail/Sell_server_cabinet_cooling_unit-9553886.html?guban=S, Guangzhou Leizig Electro-Mechanical Co., Ltd., dated May 10, 2015.

(Continued)

Primary Examiner — Mandeep S Buttar
(74) Attorney, Agent, or Firm — Barley Snyder

(57) ABSTRACT

A cooling apparatus for cooling microprocessor based equipment is disclosed. The cooling apparatus comprises a rack mountable cooling unit and a cooling control module. The rack mountable cooling unit has a rack mountable housing sized to fit in a server rack, a fan disposed in the rack mountable housing, and a cooling unit disposed in the rack mountable housing. The cooling control module has a plurality of temperature sensors connected to a controller. The controller is connected to a fan control output to control a fan speed of the fan and a cooling unit control output to control a coolant flow through the cooling unit based on signals from the plurality of temperature sensors.

24 Claims, 7 Drawing Sheets

(56) References Cited

U.S. PATENT DOCUMENTS

| | | | |
|---|---|---|---|
| 7,869,210 B2 | 1/2011 | Moss | |
| 8,051,672 B2 | 11/2011 | Mallia et al. | |
| 8,203,837 B2 | 6/2012 | Zeighami et al. | |
| 8,462,496 B2 | 6/2013 | Schmitt et al. | |
| 8,737,059 B2 * | 5/2014 | Doerrich | H05K 7/20745 165/104.33 |
| 8,743,542 B2 * | 6/2014 | Kok | F24F 11/0012 361/696 |
| 8,760,863 B2 | 6/2014 | Campbell et al. | |
| 8,817,474 B2 | 8/2014 | Campbell et al. | |
| 8,943,757 B2 * | 2/2015 | Parizeau | E04H 1/005 361/694 |
| 9,038,406 B2 | 5/2015 | Campbell et al. | |
| 9,363,926 B1 * | 6/2016 | Beall | H05K 7/20736 |
| 2001/0042616 A1 * | 11/2001 | Baer | H05K 7/20609 165/299 |
| 2008/0055846 A1 | 3/2008 | Clidaras et al. | |
| 2008/0291626 A1 | 11/2008 | Nelson et al. | |
| 2010/0304657 A1 | 12/2010 | Gallmann et al. | |
| 2010/0317278 A1 * | 12/2010 | Novick | F24F 11/0001 454/184 |
| 2011/0207392 A1 | 8/2011 | Ebermann et al. | |
| 2011/0235372 A1 * | 9/2011 | Mohr | G01R 19/0092 363/39 |
| 2011/0316706 A1 * | 12/2011 | Cash | B01D 46/0086 340/584 |
| 2012/0069514 A1 | 3/2012 | Ross | |
| 2012/0205089 A1 | 8/2012 | Doerrich et al. | |
| 2013/0062047 A1 | 3/2013 | Vaney et al. | |
| 2014/0049914 A1 | 2/2014 | Campbell et al. | |
| 2014/0049917 A1 | 2/2014 | Campbell et al. | |
| 2014/0092549 A1 | 4/2014 | Kodama | |
| 2014/0206272 A1 | 7/2014 | Kodama | |
| 2014/0292167 A1 * | 10/2014 | Sojka | H05K 7/1498 312/234 |
| 2014/0332184 A1 | 11/2014 | Tang | |
| 2015/0382512 A1 * | 12/2015 | Rogers | H05K 7/20745 361/679.49 |

OTHER PUBLICATIONS

Profusion Chill Mann, 7 pages.
InRow Chilled Water, Schneider Electric, 8 pages.
www.chillmann.com website, copyright 2014 Chillman LLC, 2 pages.
PCT Notification, International Search Report and Written Report of the International Searching Authority, dated Dec. 8, 2016, 11 pages.
IP and Written Opinion issued in International application No. PCT/US2016/052176, dated Mar. 29, 2018.

* cited by examiner

COOLING APPARATUS WITH A CONTROL SYSTEM FOR COOLING MICROPROCESSOR BASED EQUIPMENT

CROSS-REFERENCE TO RELATED APPLICATIONS

This application claims the benefit of the filing date under 35 U.S.C. § 119(a)-(d) of U.S. Provisional Patent Application No. 62/219,405, filed Sep. 16, 2015.

FIELD OF THE INVENTION

The invention relates to a cooling apparatus and, more particularly, to a cooling apparatus having a control system for removing heat produced in microprocessor-based equipment such as servers, switches, SANS, and other similar information technology and telecommunications components.

BACKGROUND

Performance of microprocessor-based computer servers, switches, and similar hardware continuously improves, leading to greater power consumption and ever-increasing challenges in maintaining appropriate environmental conditions. The heat generated during operation has an adverse effect on the performance and reliability of the hardware components. Accordingly, cooling systems have been developed to maintain satisfactory operating temperature conditions. Known cooling systems often use fans and various heat absorbing fluids to dissipate heat from the hardware enclosure. However, many of these known cooling systems require a constant running of fans and thus waste energy. Others utilize variable speed fans, but in these systems, the fan speed has no relationship with the volume of air demanded by the computing equipment. Therefore, there is a need for an efficient and optimized cooling system that provides close-coupled cooling with precisely managed airflow that more appropriately meets the requirements of the heat producing computer equipment.

SUMMARY

In view of the aforementioned shortcomings, an object of the invention, among others is to provide a close coupled dynamically controlled cooling apparatus. The disclosed cooling apparatus comprises a rack mountable cooling unit and a cooling control module. The rack mountable cooling unit has a rack mountable housing sized to fit in a server rack, a fan disposed in the rack mountable housing, and a cooling unit disposed in the rack mountable housing. The cooling control module has a plurality of temperature sensors connected to a controller. The controller is connected to a fan control output to control a fan speed of the fan and a cooling unit control output to control a coolant flow through the cooling unit based on signals from the plurality of temperature sensors.

BRIEF DESCRIPTION OF THE DRAWINGS

The invention will now be described by way of example with reference to the accompanying figures, of which.

DETAILED DESCRIPTION OF THE EMBODIMENT(S)

Embodiments of the invention will now be described in greater detail with reference to the drawings.

Figure 1:
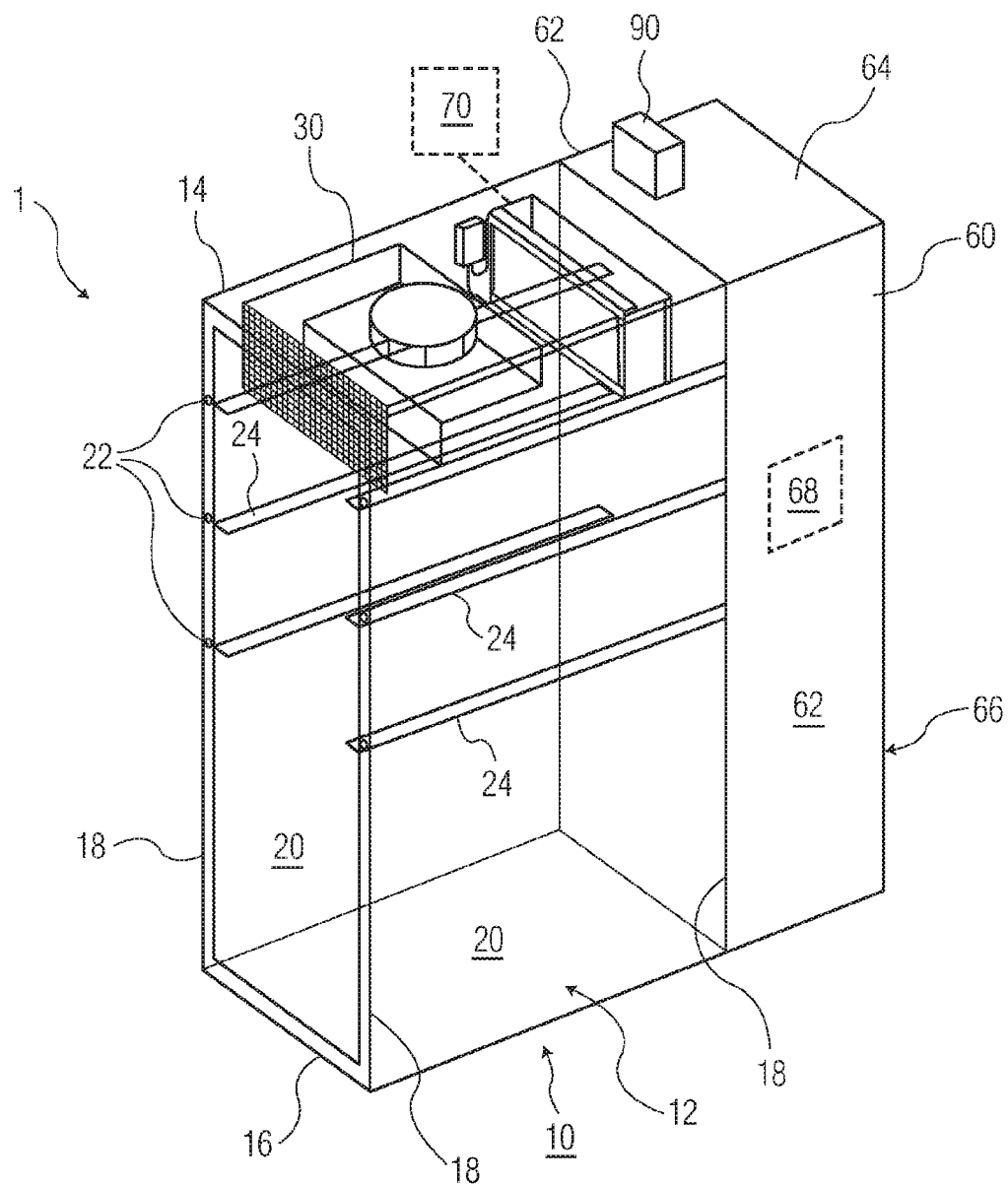
FIG. 1 is a perspective view of a cooling apparatus according to the invention.

First, with reference to FIG. 1, a cooling apparatus 1 according to the invention is shown. Generally, the cooling apparatus 1 includes a server housing 10, a rack mountable cooling unit 30, a containment section 60, a cooling control module 70, and an engineered control passageway 90.

Now, with reference to FIG. 1, the server housing 10 will be described. As shown, the server housing 10 includes an enclosure 12 having a plurality of server racks 22.

As shown, the enclosure 12 includes an upper frame 14, a lower frame 16, and a plurality of supports 18. Supports 18 are positioned between the upper frame 14 and the lower frame 16 along outer walls 20. The supports 18 are positioned parallel to each other and substantially perpendicular to the upper frame 14 and the lower frame 16. One skilled in the art should appreciate that more or less supports 18 could be used. In the shown embodiment, the upper frame 14, the lower frame 16, and supports 18 are made from a rigid material, such as aluminum, or other metal.

In the shown embodiment, the server rack 22 includes a plurality of rails 24 positioned in pairs and stacked horizontally within the enclosure 12. The rails 24 are connected to the supports 18 using fasteners (not shown). One skilled in the art should appreciate that any known fasteners could be used, including nuts and bolts, screws, and adhesives. However, removable fasteners could also be used, such as latches, which allow modification and re-arrangement of the rails 24. As shown, each pair of rails 24 are positioned parallel to each other, on opposite sides of the enclosure 12. Each rail 24 connects to a pair of supports 18. In the shown embodiment, each rail 24 is L-shaped shape. However, in an alternate embodiment, each rail 24 could have any suitable shape. The server rack 22 can be easily configured to fit specified computer components by adjusting placement of the rails 24 up and down the supports 18 within the enclosure 12.

As shown in FIG. 1, the containment section 60 is an enclosed cabinet, such as a standard hot air containment cabinet. For instance, the shown containment section 60 includes a pair of side panels 62 positioned parallel to each other, a top shelf 64 positioned on the pair of side panels 62, and a back panel 66 connecting to the side panels 62 and top shelf 64. The containment section 60 provides an air receiving space 68 that extends along an interior thereof. However, one skilled in the art should appreciate other design are possible. For instance, while the containment section 60 is shown as a separate structure form the enclosure 12, it is possible that the containment section 60 is an integral structure of the enclosure 12 to provide the air receiving space 68 on one side of the plurality of servers.

In the shown embodiment, the containment section 60 is positioned adjacent a back side of the enclosure 12. The containment section 60 is in fluid communication with an interior of the enclosure 12, and the containment section 60 sits substantially planar to the enclosure 12 in order to trap air transferred from the back side thereof. In the shown embodiment, the side panels 62 may be easily configured to attach to the enclosure. The side panels 62 may also be sheet metal, sheet rock, glass, wood, particle board, Styrofoam®, or any other material capable of preventing air from passing there through.

In the embodiment, the containment section 60 may be sealed along all edges of the enclosure to ensure that air cannot escape along edges thereof. For example, a sealer may be adhered around the edges of the enclosure 12. Additionally or alternatively, the side panels 62 may be attached to the enclosure using a fastener such as bolts, screws, clamps, adhesive, epoxy, etc.

Figure 2:
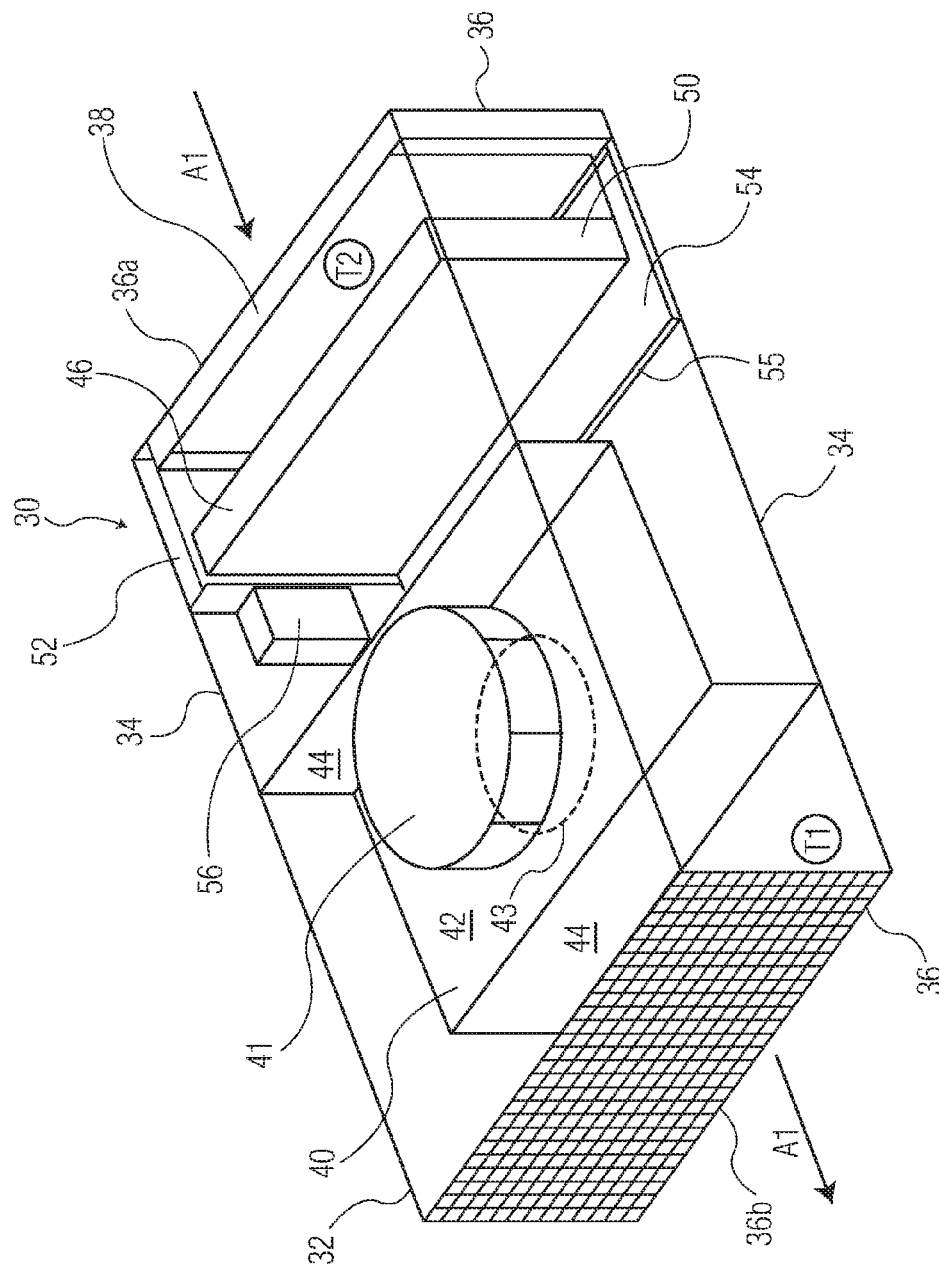
FIG. 2 is a perspective view of a rack mountable cooling unit of the cooling apparatus of FIG. 1.
Figure 3:
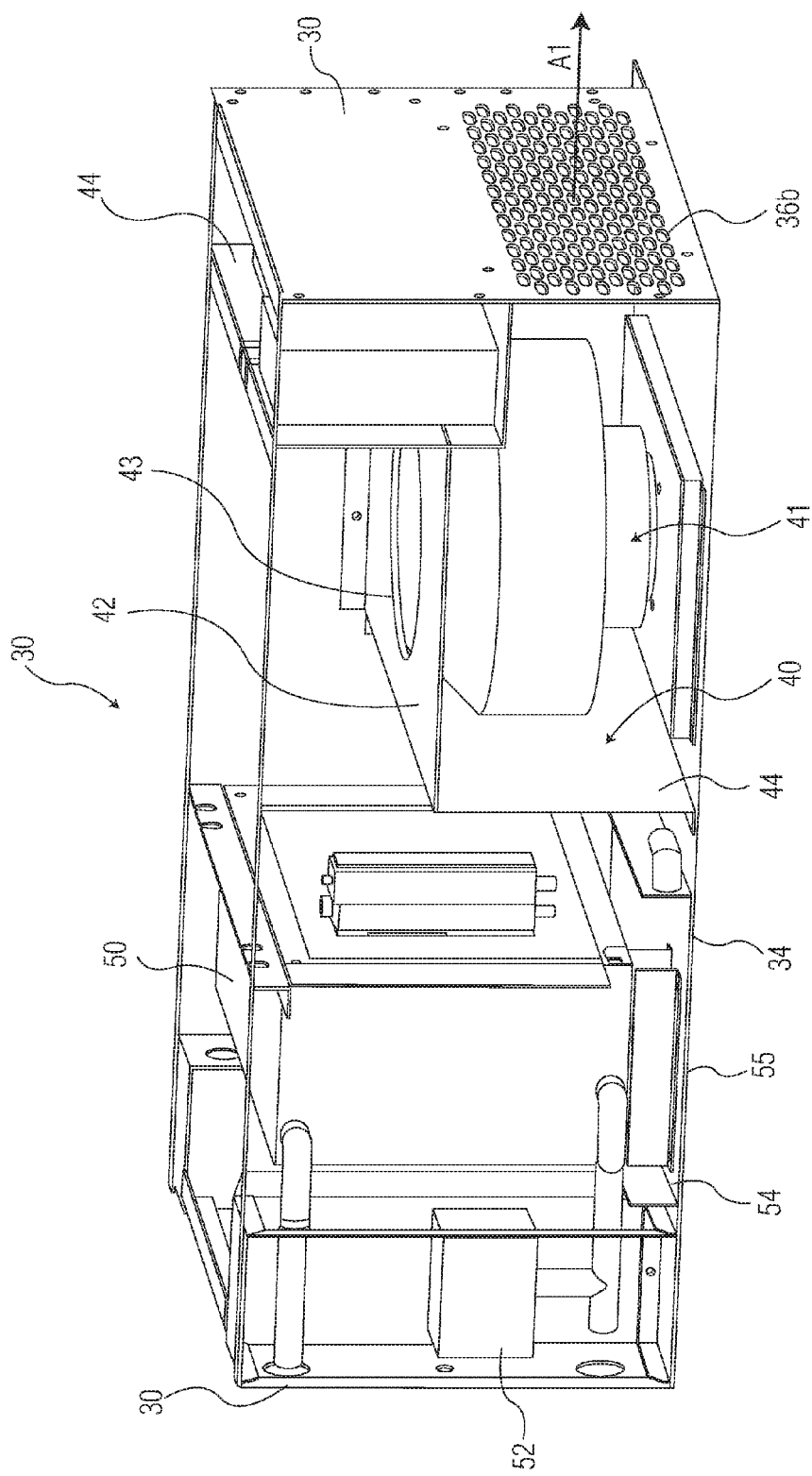
FIG. 3 is a perspective sectional view of the rack mountable cooling unit of the cooling apparatus of FIG. 1.

Now with reference to FIGS. 2 and 3, the rack mountable cooling unit 30 is shown and includes a rack mountable housing 32, a fan support 40, a fan 41, a cooling unit 46, a collection pan 54 and a condensate pump 56. The rack mountable housing 32 is a rigid support having a box shape. The rack mountable housing 32 includes a pair of side walls 34 and a pair of end walls 36 connected by top and bottom walls shown in phantom here so that internal components are visible for this description. As shown, the rack mountable housing 32 is a rectangular box. The rack mountable housing 32 is made of a rigid material, such as aluminum or stainless steel. However, one skilled in the art should appreciate the rack mountable housing 32 could be manufactured from other materials, such as plastics or composites.

As shown, the rack mountable housing 32 is sized to fit in the enclosure 12 and, more particularly, to fit within the server rack 22, which may be a server rack 22 of standard size. Accordingly, the rack mountable housing 32 is sized and shaped to correspond to a computer component, such as a server. One with ordinary skill in the art would appreciate the exterior shape, size, appearance, and arrangement of internal components within the rack mountable cooling unit 30 could vary without departing from the scope of the invention.

In the shown embodiment, one end wall 36 includes a meshed or grated plate shaped member 36b, while the other end wall includes a filter receiving passageway 36a that is sized to hold an air filter 38.

With reference to FIG. 2, the fan support 40 is shown and is generally shaped and sized to support the fan 41. As shown, the fan support 40 includes a lateral support 42 and a pair of vertical supports 44. The vertical supports 44 extend from opposite sides of the lateral support 42. In the shown embodiment, one vertical support 44 extends from one side of the lateral support 42, while the other vertical support 44 extends from an opposite side thereof. The vertical supports 44 extend in opposite directions. As shown, one vertical support 44 extends from a lower surface of the lateral support 42, while the other vertical support 44 extends from an upper surface of the vertical support 44. The lateral support 42 includes a fan receiving section 43, shown as a hole in the disclosed embodiment, which extends completely through the lateral support 42.

In the shown embodiment, the fan support 40 is bent and shaped from a single sheet of material, such as sheet metal. As shown, one vertical support 44 is bent downward from one side of the lateral support 42, while the other vertical support 44 is bent upward from an opposite side thereof. However, one skilled in the art should appreciate that the fan support 40 could be made of other materials, such as plastic, and is molded into the shape shown. According to the invention, a height of the fan support 40 is substantially equal to a height of the pair of side walls 34.

The fan 41 could be a variable speed electrical fan, a driven impeller, a propeller fan, a backward inclined fan, an electronically commutated motor, or a variable speed axial-flow fan, and is sized to fit in the fan receiving section 43 of the lateral support 42 and move air horizontally from one side of the lateral support 42 to the other. The fan 41 is mounted horizontally in this embodiment in order to move more air than a vertically mounted fan and to be optimally controllable for selective dynamically controlled airflow as will be describe in greater detail below. In alternative embodiments, a plurality of fans 41 may be disposed within the rack mountable cooling unit 30.

As shown in FIG. 2, the vertical support 44 closest to the cooling unit 46 extends upward from the lateral support 42, while the vertical support 44 closest to the end wall 36 extends downward from the lateral support 42. As a result, the flow of air travels under the lateral support 42 and upward through the fan receiving section 43 via the fan 41. However, in another embodiment, as shown in FIG. 3, the vertical support 44 closest to the cooling unit 46 extends downward from the lateral support 42, while the vertical support 44 closest to the end wall 36 extends upward from the lateral support 4. Accordingly, air flows along a path indicated by the arrows A1 over the lateral support 42 and downward through the fan receiving section 43 via the fan 41. In both designs, a larger fan 41 is provided since it sits laterally with respect to a planar surface of the lateral support 42.

With reference to FIGS. 2 and 3, the cooling unit 46 is a standard heat exchanger with a cooling coil 50 connected by control valve 52 to an external source (not shown) of circulating coolant such as chilled water, condenser water, compressed refrigerant, liquid refrigerant, a glycol and water solution, mineral oil, or other heat transfer fluid or gas. A series of generally planar metallic fins (not shown) are disposed in spaced face-to-face relationship for heat exchange.

The collection pan 54 shown in FIG. 2 is a standard condensate drain pain. It is sized to correspond to the cooling unit 46, to collect condensate dripping from the cooling unit 46. The condensate pump 56 is positioned to remove condensate from the collection pan 54 to an outside reservoir or a waste outlet.

Figure 4:
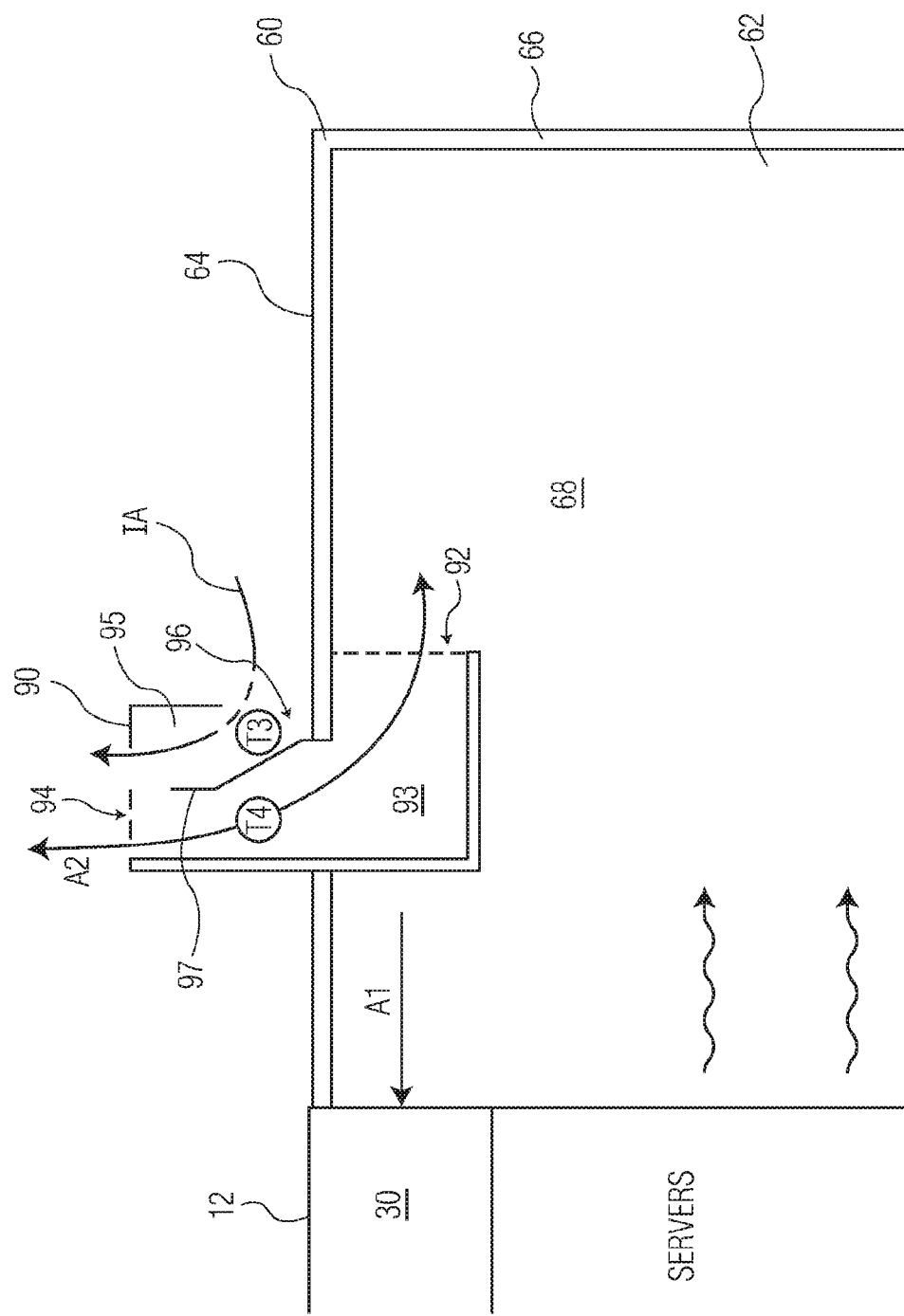
FIG. 4 is a schematic diagram of an engineered control passageway of the cooling apparatus of FIG. 1.

Now with reference to FIG. 1, the engineered control passageway 90 will be described. In the shown embodiment, the engineered control passageway 90 extends through an opening extending in the containment section 60. More particularly, as shown in FIG. 4, the engineered control passageway 90 extends through the top shelf 64 and into the air receiving space 68. While the engineered control passageway 90 is positioned along the top shelf 64, one skilled in the art should appreciate that the engineered control passageway 90 could be positioned along any of the outer surface of the enclosure 12, especially if the containment section 60 is provided with the enclosure 12 as a single structure. As shown, the engineered control passageway 90 is sized such that air and heat generated within the containment section 60 can easily flow there through.

In an exemplary embodiment shown in FIG. 4, the engineered control passageway 90 includes an interior passageway 92, a first exterior passageway 94, and a second exterior passageway 96.

The interior passageway 92 is positioned in the air receiving space 68, while the first exterior passageway 94 and the second exterior passageway 96 and positioned outside the containment section 60 and in the open air. A first air column 93 is disposed in the engineered control passageway 90 and extends between the interior passageway 92 and the first exterior passageway 94. A second air column 95 is disposed in the engineered control passageway 90 and extends between the first exterior passageway 94 and the second exterior passageway 96. The first air column 93 runs substantially parallel to the second air column 95 and is separated therefrom by an interior wall 97 separating the first exterior passageway 94. In the shown embodiment, the first air column 93 is l-shaped. Likewise, the second air column 95 in the shown embodiment is also L-shaped. However, one skilled in the art should appreciate that other designs are possible.

As shown in FIG. 4, the first air column 93 allows ingress/egress of air along the path A2 between the interior passageway 92 and the first exterior passageway 94 and, more particularly, the ingress/egress of air from inside to outside the containment section 60, and vice versa. The second air column 95 allows ingress/egress of air between the first exterior passageway 94 and the second exterior passageway 96. As shown, the second air column 95 allows induced air IA to flow through the first air column 93

Next, with reference to FIGS. 1 and 5, the cooling control module 70 will be described. The cooling control module 70 includes a controller 72 and a plurality of temperature sensors 80.

In the embodiment shown, the controller 72 includes a processor 73, memory 74, a power input 75, a water detection input 76, a fan control output 77, a cooling unit control output 78, a display unit 79, a switch 82, and a manual control input 84.

The processor 73 is a central processing unit (CPU) capable of carrying out instructions of a computer program by performing the arithmetic, logical, control and input/output (I/O) operations specified by one or more set of instructions. The memory 74 is a non-transitory computer readable medium used to retain digital data and computer programs. The power input 75 is connected to a power source and provides power to the controller 72 and possibly other components. The power source may be designed for any voltage, including, for example, 120V, 208V, 240V, 415V, or 480V for alternating current, or 12V or 48V for direct current. The water detection input 76 is fed from a sensor D1 capable of detecting water level in the drain pan 54.

The fan control output 77 is operatively connected to a fan speed controller (not shown) for the fan 41. The switch 82 is connected between the controller 72 and the fan control output 77, and when operated, switches an input to the fan control output 77 between the controller 72 and a manual control input 84. The manual control input 84 may be a knob, a slider, or any other manual control input device known to those with ordinary skill in the art. The manual control input 84 may alternatively be part of the display unit 79.

The cooling unit control output 78 is operatively connected to a control valve 52 for the cooling unit 46. The display unit 79 is a graphical display capable of showing current status and conditions of the rack mountable cooling unit 30. It may also be a touch screen providing user input, such as from the manual control input 84, and instructions to the processor 73.

As shown in FIG. 4, an induced air temperature sensor T3 and an interior air temperature sensor T4 are positioned along opposite sides of the interior wall 97. In particular, the induced air temperature sensor T3 is positioned inside the second air column 95, while the interior air temperature sensor T4 is positioned inside the first air column 93. In the embodiment shown, the induced air temperature sensor T3 and the interior air temperature sensor T4 are positioned along an axis extending through the engineered control passageway 90. One skilled in the art should appreciate that the locations of the induced air temperature sensor T3 and the interior air temperature sensor T4 are not limited to what is shown, but could be in various arrangements to sense temperature inside and outside of the enclosure respectively.

Figure 5:
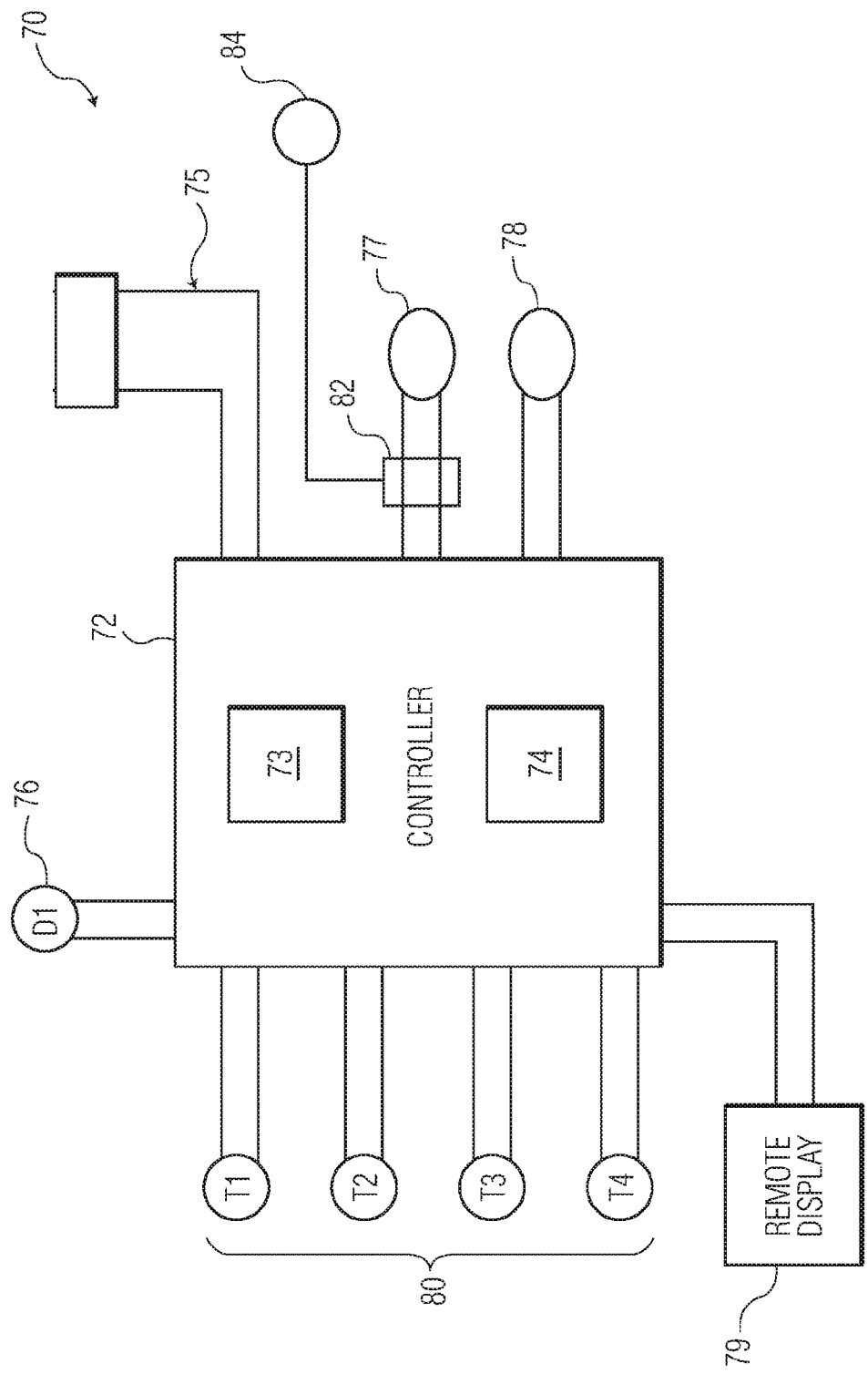
FIG. 5 is a schematic diagram of a cooling control module of the cooling apparatus of FIG. 1.

As shown in FIGS. 1 and 5, temperature sensors 80 are connected to the controller 72. In the shown embodiment, four temperature sensors 80 are used, including a unit output temperature sensor T1, a unit input temperature sensor T2, an induced air temperature sensor T3, and an interior air temperature sensor T4. Each temperatures sensor 80 may be a thermistor. However, one skilled in art should appreciate that a thermocouple, resistance thermometer, or other known sensor could be used to measure temperature at these locations.

As shown in FIG. 2, the unit output temperature sensor T1 and the unit input temperature sensor T2 are positioned along opposite end walls 36. In particular, the unit output temperature sensor T1 is positioned along the meshed or grated plate shaped member 36b, while the unit input temperature sensor T2 is positioned along the filter receiving passageway 36a. One skilled in the art should appreciate that the locations of the unit output temperature sensor T1 and the unit input temperature sensor T2 are not limited to what is shown, but could be positioned in various arrangement on opposite sides of the fan 41 and cooling unit 46.

Now with reference to the FIGS. 1 and 4, a method of operating the cooling apparatus 1 according to the invention will be described.

The cooling apparatus 1 is generally used in the shown embodiment to regulate airflow and, more particularly, to measure the relative temperatures inside the server housing 10 and remove heat dynamically to meet satisfactory operating conditions for one or more computer component mounted in the server housing 10. One skilled in the art should appreciate that the cooling apparatus 1 is particularly suitable for but not limited to use for server farms or other devices that require maintenance of variable thermal operating conditions. The cooling apparatus 1 is also suitable for fiber optic and wireless shelter enclosures, weatherproof equipment enclosures, micro data centers, edge data centers, distributed cloud enclosures, content distribution facilities, network/peering centers and other forms of distributed platforms.

An air path A1, as shown in FIGS. 2 and 3, enters the rack mountable cooling unit 30 at the filter receiving passageway 36a, extends over the cooling unit 46, then passes through the fan 41, and exits the rack mountable cooling unit 30 at the meshed or grated plate shaped member 36b.

The cooling unit control output 78 adjusts the control valve 52 to regulate coolant flow through the cooling coil 50 based on signals from the unit output temperature sensor T1 and the unit input temperature sensor T2. A coil control algorithm stored in the memory 74 varies the cooling unit control output 78 and control valve 52 position to maintain a user defined setting at T1. For example, if the temperature measured at T1 is greater than the user-defined setting, the cooling unit control output 78 will increase, thus gradually opening the cooling control valve, allowing more coolant to flow through the cooling coil 50. Likewise, if the temperature at T1 is less than the setting the cooling unit control output 78 is reduced to gradually closing the valve. The controller performs a calculation, subtracting T2 from T1, and displays T1, T2 and the resultant "delta T" from this calculation on the display unit 79 for user information only. The set point for T1 is user-adjustable through the remote display, or through direct serial connection to the controller. One skilled in the programming of similar controllers can appreciate that other algorithms could be utilized to control the cooling valve.

The fan control output 77, is connected to the fan speed controller (not shown), and adjusts fan speed based on signals from the induced air temperature sensor T3 and the interior air temperature sensor T4 to achieve certain conditions at T3 and T4. T3 continuously measures the temperature external to the containment section 60, but proximate to the engineered control passageway 90. T4 measures the airflow temperature as it passes through the first air column 93, either in or out of the containment section 60. A user may toggle the switch 82 to provide input to the fan control output 77 from either the controller 72 or the manual control input 84.

When the switch 82 is in a position providing input to the fan control output 77 from the controller 72, the fan speed controller (not shown) utilizes a first fan control algorithm stored in the memory 74 to adjust fan speed to maintain certain conditions relative to T3 and T4. The first fan control algorithm subtracts T4 from T3, and if the difference is above a user set value, this indicates hot server exhaust air is exiting the containment section 60. When this occurs, the fan control output 77 increases the fan speed. When the fan speed controller (not shown) increases fan speed until such time as T4-T3 is less than a user set value, at which time the fan speed controller (not shown) will stop increasing the fan speed. After a user-set time delay, a first cooling optimization algorithm stored in the memory 74 is performed. The first cooling optimization algorithm reduces the fan speed to a minimum value necessary to match server exhaust airflow. When the first cooling optimization algorithm starts, the fan control output 77 is slowly reduced a user definable step, for each user definable time period. This action slows the fan 41 at a very slow rate to minimize energy use. The first cooling optimization algorithm continues to operate until such time as T4 minus T3 is greater than the user defined setting. When T4 minus T3 is greater than the setting, the first cooling optimization algorithm stops changes in the fan speed 41, and after a user-set time delay, the fan speed is increased per the previously described first fan control algorithm.

When the switch 82 is in a position providing input to the fan control output 77 from the manual control input 84, the user adjusts the manual control input 84 to manually control the speed of the fan 41. The first fan control algorithm and the first cooling optimization algorithm may still calculate the difference between T4 and T3 and determine the optimal fan speed as described above. However, instead of sending instructions to the fan control output 77, the first fan control algorithm and the first cooling optimization algorithm output corresponding fan speed instructions to the user on the display unit 79, such as to increase the fan speed or decrease the fan speed via the manual control input 84.

One skilled in the operation of similar systems will appreciate that the settings for fan speed control, including the temperature difference T4-T3, fan speed ramp up step and interval, and fan speed ramp down step and time interval can be adjusted to "tune" the system to multiple different arrangement of servers. One skilled in programming similar controllers can also appreciate that other algorithms, including the coil control algorithm, can be utilized to achieve similar operating sequences.

Figure 6:
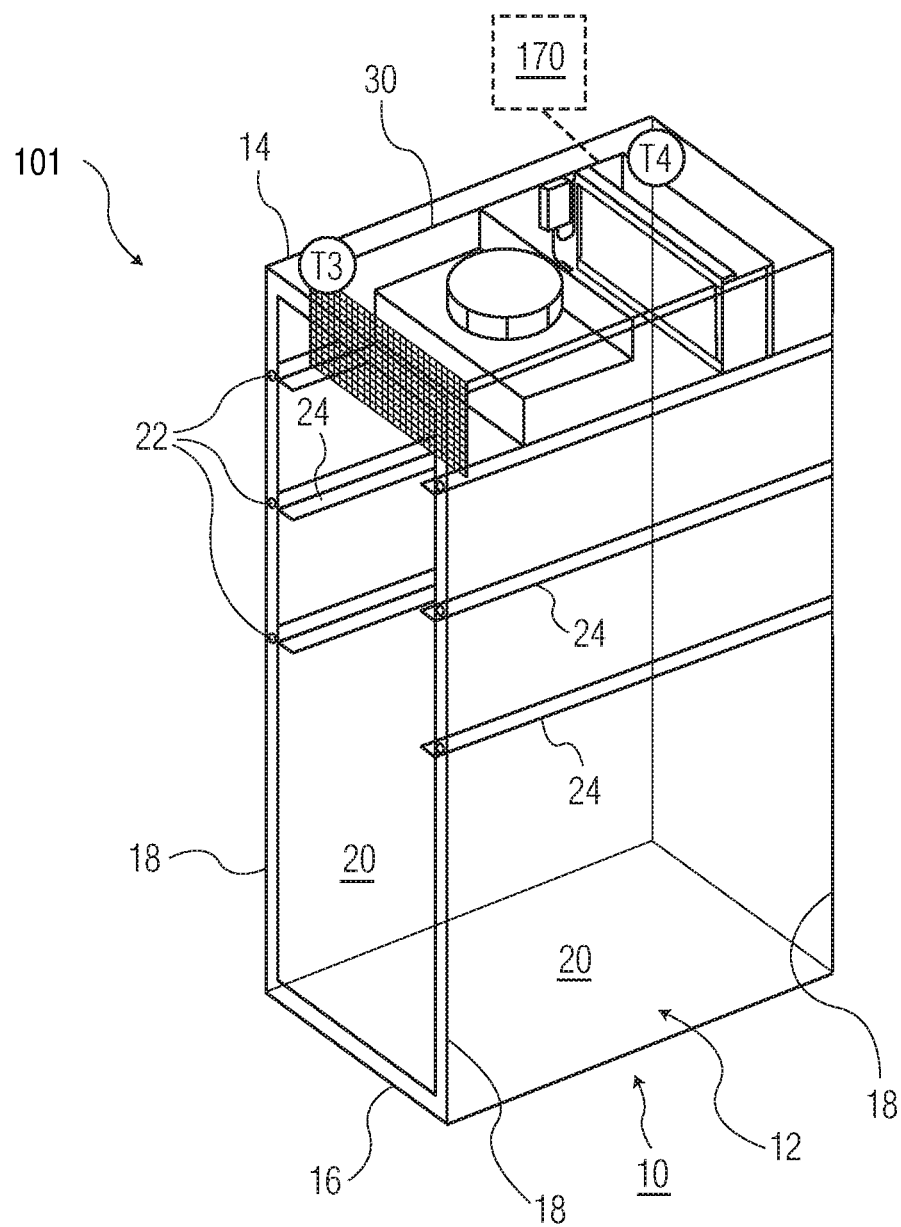
FIG. 6 is a perspective view of another cooling apparatus according to the invention.
Figure 7:
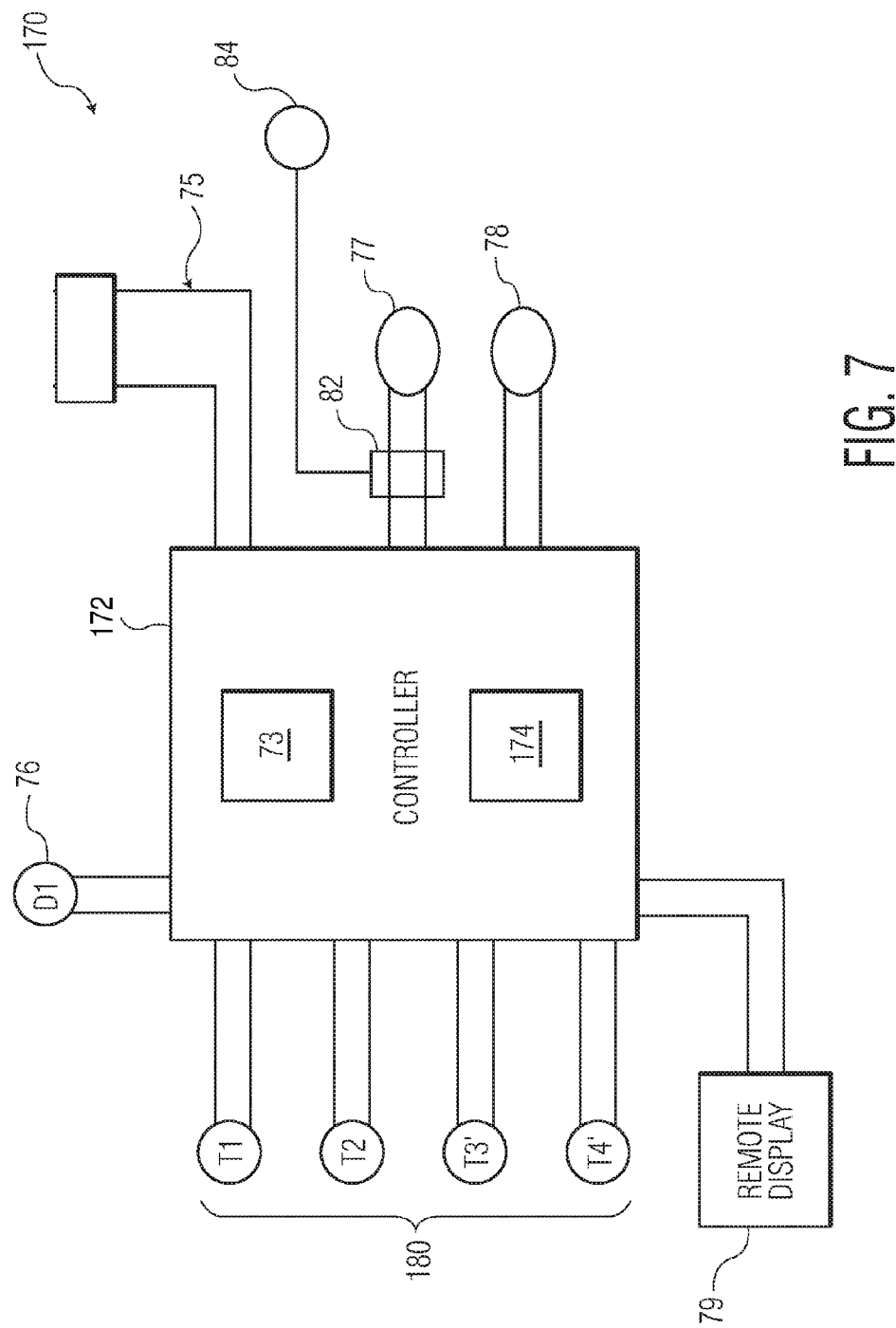
FIG. 7 is a schematic diagram of a cooling control module of the cooling apparatus of FIG. 6.

A cooling apparatus 101 according to another embodiment of the invention is shown in FIGS. 6 and 7. Like reference numbers indicate like elements, and only the differences with respect to the embodiment of FIGS. 1-5 will be described herein. The cooling apparatus 101 of FIG. 6 has the server housing 10, the rack mountable cooling unit 30, and a cooling control module 170. The cooling apparatus 101 does not include the containment section 60 or the engineered control passageway 90 of the embodiment of FIGS. 1-5.

The cooling control module 170 includes a controller 172 and a plurality of temperature sensors 180. The controller 172, in contrast to the controller 72 described above, has a memory 174 having stored thereon the coil control algorithm, a second fan control algorithm and a second cooling algorithm. The memory 174 is a non-transitory computer readable medium.

As shown in FIG. 7, the temperature sensors 180 are connected to the controller 172. In the shown embodiment, four temperature sensors 180 are used, including the unit output temperature sensor T1, the unit input temperature sensor T2, an first exterior temperature sensor T3', and a second exterior temperature sensor T4'.

As shown in FIG. 6, the first exterior temperature sensor T3' and the second exterior temperature sensor T4' are placed on top of the enclosure 12. One skilled in the art should appreciate that the locations of the first and second exterior temperature sensors T3' and T4' are not limited to what is shown, but rather the first and second exterior temperature sensors T3' and T4' may alternatively be placed anywhere in the environment external to the server housing 10. In alternative embodiments, more than two exterior temperature sensors may be used, or only one exterior temperature sensor T3' or T4' may be used.

The fan control output 77 is connected to the fan speed controller (not shown) and adjusts the fan speed to achieve certain conditions at T3' and T4'. Both the first and second exterior temperature sensors T3' and T4' continuously measure the temperature external to the cooling apparatus 101. A user may toggle the switch 82 to provide input to the fan control output 77 from either the controller 172 or the manual control input 84.

When the switch 82 is in a position providing input to the fan control output 77 from the controller 172, the fan speed controller (not shown) utilizes the second fan control algorithm stored in the memory 174 to adjust fan speed to maintain certain conditions relative to T3' and T4'. The second fan control algorithm compares T3' and T4' to a user defined temperature setpoint. When either of the temperatures T3' and T4' exceeds the user defined temperature setpoint, the second fan control algorithm controls the fan control output 77 to gradually increase the fan 41 speed by a user definable increment every defined time period until each of the temperatures T3' and T4' have not changed for the defined time period. Once the temperatures T3' and T4' have not changed for the defined time period, the second cooling optimization algorithm stored in the memory 174 is performed. The second cooling optimization algorithm reduces the fan speed until either of the temperatures T3' and T4' changes. When either of the temperatures T3' and T4' changes, the process loops back to execute the second fan control algorithm as described above. The second fan control algorithm also compares T3' and T4' to an upper temperature limit. When either of the temperatures T3' and T4' exceeds the upper temperature limit, the second fan control algorithm controls the fan control output 77 to run the fan 41 at a maximum speed. When the temperatures T3' and T4' are both below the upper temperature limit, the second fan control algorithm controls the fan control output 77 in comparison to the user-defined temperature setpoint as described above.

When the switch 82 is in a position providing input to the fan control output 77 from the manual control input 84, the second fan control algorithm and the second cooling optimization algorithm may still determine the optimal fan speed as described above. However, instead of sending instructions to the fan control output 77, the second fan control algorithm and the second cooling optimization algorithm output corresponding fan speed instructions to the user on the display unit 79, such as to increase the fan speed or decrease the fan speed via the manual control input 84.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. A cooling apparatus for cooling microprocessor based equipment, comprising:
    a rack mountable cooling unit having a rack mountable housing sized to fit in a server rack, a fan disposed in the rack mountable housing, and a cooling unit disposed in the rack mountable housing; and
    a cooling control module having a plurality of temperature sensors connected to a controller, the plurality of temperature sensors including a unit output temperature sensor and a unit input temperature sensor disposed in the rack mountable housing and an exterior temperature sensor disposed external to a server housing containing the server rack, the controller connected to a fan control output to control a fan speed of the fan and a cooling unit control output to control a coolant flow through the cooling unit based on signals from the plurality of temperature sensors, and if an exterior temperature sensed by the exterior temperature sensor is above a user defined temperature setpoint, the controller increases the fan speed until the exterior temperature sensed by the exterior temperature sensor has not changed for a user defined time period.

2. The cooling apparatus of claim 1, wherein the rack mountable housing has a meshed or grated plate shaped member at a first end and a filter receiving passageway at an opposite second end.

3. The cooling apparatus of claim 2, wherein an air path enters the rack mountable cooling unit at the filter receiving passageway, extends over the cooling unit, passes through the fan, and exits the rack mountable cooling unit at the meshed or grated plate shaped member.

4. The cooling apparatus of claim 3, wherein the fan is mounted horizontally within the rack mountable housing.

5. The cooling apparatus of claim 4, wherein the unit output temperature sensor is positioned along the meshed or grated plate shaped member and the unit input temperature sensor is positioned along the filter receiving passageway.

6. The cooling apparatus of claim 5, wherein the controller controls the coolant flow through the cooling unit to maintain a user defined unit output temperature at the unit output temperature sensor.

7. The cooling apparatus of claim 6, wherein a temperature difference between the unit input temperature sensor and the unit output temperature sensor is displayed on a display unit.

8. The cooling apparatus of claim 1, further comprising a switch connected between the controller and the fan control output operable to switch an input to the fan control output between the controller and a manual control input.

9. The cooling apparatus of claim 8, wherein the switch is in a position providing input to the fan control output from the controller and the controller controls the fan speed.

10. The cooling apparatus of claim 9, wherein the switch is in a position providing input to the fan control output from the manual control input and the controller displays fan speed instructions on a display unit.

11. The cooling apparatus of claim 1, wherein the controller increases the fan speed by a user defined increment each user defined time period.

12. The cooling apparatus of claim 1, wherein, if the exterior temperature sensed by the exterior temperature sensor has not changed for the user defined time period, the controller reduces the fan speed until the exterior temperature sensed by the exterior temperature sensor changes.

13. The cooling apparatus of claim 12, wherein, if the exterior temperature sensed by the exterior temperature sensor is above an upper temperature limit, the controller controls the fan to run at a maximum speed.

14. A cooling apparatus for cooling microprocessor based equipment, comprising:
    a server housing having a plurality of server racks;
    a rack mountable cooling unit having a rack mountable housing sized to fit in one of the plurality of server racks, a fan disposed in the rack mountable housing, and a cooling unit disposed in the rack mountable housing;
    a containment section having an air receiving space in fluid communication with an interior of the server housing;
    a cooling control module having a plurality of temperature sensors connected to a controller, the controller connected to a fan control output to control a fan speed of the fan and a cooling unit control output to control a coolant flow through the cooling unit based on signals from the plurality of temperature sensors, the plurality of temperature sensors including a unit output temperature sensor and a unit input temperature sensor disposed in the rack mountable housing; and
    an engineered control passageway extending into the air receiving space through an opening in the containment section, the plurality of temperature sensors including an induced air temperature sensor and an interior air temperature sensor disposed in the engineered control passageway, and if a difference between an interior air temperature sensed by the interior air temperature sensor and an induced air temperature sensed by the induced air temperature sensor is greater than a user defined temperature difference, the controller increases the fan speed until the difference is less than the user defined temperature difference, and if the difference is less than the user defined temperature difference for a user set time delay, the controller reduces the fan speed until the difference is greater than the user defined temperature difference.

15. The cooling apparatus of claim 14, wherein the engineered control passageway has an interior passageway positioned in the air receiving space communicating with a first air column and a first exterior passageway positioned outside the containment section.

16. The cooling apparatus of claim 15, wherein the engineered control passageway has a second exterior passageway positioned outside of the containment section communicating with a second air column and the first exterior passageway.

17. The cooling apparatus of claim 16, wherein the induced air temperature sensor is positioned in the second air column and the interior air temperature sensor is positioned in the first air column.

18. The cooling apparatus of claim 14, further comprising a switch connected between the controller and the fan control output operable to switch an input to the fan control output between the controller and a manual control input.

19. The cooling apparatus of claim 18, wherein the switch is in a position providing input to the fan control output from the controller and the controller controls the fan speed.

20. The cooling apparatus of claim 19, wherein the switch is in a position providing input to the fan control output from the manual control input and the controller displays fan speed instructions on a display unit.

21. The cooling apparatus of claim 14, wherein the controller reduces the fan speed by a user definable step for each of a user definable time period.

22. A cooling apparatus for cooling microprocessor based equipment, comprising:
   a server housing having a plurality of server racks;
   a rack mountable cooling unit having a rack mountable housing sized to fit in one of the plurality of server racks, a fan disposed in the rack mountable housing, and a cooling unit disposed in the rack mountable housing;
   a containment section having an air receiving space in fluid communication with an interior of the server housing;
   a cooling control module having a plurality of temperature sensors connected to a controller, the controller connected to a fan control output to control a fan speed of the fan and a cooling unit control output to control a coolant flow through the cooling unit based on signals from the plurality of temperature sensors, the plurality of temperature sensors including a unit output temperature sensor and a unit input temperature sensor disposed in the rack mountable housing; and
   an engineered control passageway extending into the air receiving space through an opening in the containment section, the engineered control passageway having an interior passageway positioned in the air receiving space communicating with a first air column and a first exterior passageway positioned outside the containment section, the plurality of temperature sensors including an induced air temperature sensor and an interior air temperature sensor disposed in the engineered control passageway.

23. The cooling apparatus of claim 22, wherein the engineered control passageway has a second exterior passageway positioned outside of the containment section communicating with a second air column and the first exterior passageway.

24. The cooling apparatus of claim 23, wherein the induced air temperature sensor is positioned in the second air column and the interior air temperature sensor is positioned in the first air column.

\* \* \* \* \*